United States Patent [19]

Noguchi et al.

[11] 4,429,457

[45] Feb. 7, 1984

[54] PROCESS FOR MANUFACTURING A PRINTED CIRCUIT BOARD

[75] Inventors: Yoshiyasu Noguchi, Musashino; Shoji Yokokoji, Sayama; Shozo Saito; Kiketsu Hasegawa, both of Tokyo, all of Japan

[73] Assignee: Toppan Printing Co., Ltd., Japan

[21] Appl. No.: 312,820

[22] Filed: Oct. 19, 1981

[30] Foreign Application Priority Data

Oct. 22, 1980 [JP] Japan ................................ 55-147853

[51] Int. Cl.³ ............................................. H05K 3/34
[52] U.S. Cl. ........................................ 29/840; 148/25; 427/96
[58] Field of Search ................. 29/830, 840; 228/223, 228/224, 245; 156/324.4, 324; 148/23, 25; 427/96

[56] References Cited

U.S. PATENT DOCUMENTS 3,730,782  5/1973  Poliak et al. ................. 148/25 X
4,127,436 11/1978  Friel ............................. 427/96 X
4,194,931  3/1980  Zado ........................... 228/223 X

FOREIGN PATENT DOCUMENTS 857000 11/1970 Canada ................................ 29/840

Primary Examiner—Howard N. Goldberg
Assistant Examiner—Carl J. Arbes
Attorney, Agent, or Firm—Ostrolenk, Faber, Gerb & Soffen

[57] ABSTRACT

The printed circuit board for mounting electronic parts thereon is obtained by transferring flux from a supporting film to the surface of a printed circuit board, and soldering the electronic parts thereto after the supporting film is removed. The supporting film is first coated with the flux, and the flux is transferred to the printed circuit board through the application of heat and pressure. Hot air can be blown from an oblique direction on the flux-coated surface of the printed circuit board after the flux is transferred thereto and before the electronic parts are soldered thereto.

This method can provide a uniform flux coat on the printed circuit board and can eliminate various drawbacks which are encountered in conventional approaches in which the surface of the printed circuit board is coated directly with flux in liquid form.

17 Claims, 3 Drawing Figures

PROCESS FOR MANUFACTURING A PRINTED CIRCUIT BOARD

BACKGROUND OF THE INVENTION

1. Field of the Invention

The present invention relates to a process for manufacturing a printed circuit board, including a flexible type as well as a plate type.

2. Brief Description of the Prior Art

The development of semiconductor circuit techniques has generalized and necessitated the use of printed circuit boards as components of electronic devices or instruments. Conventional procedures of manufacturing printed circuit boards include the steps of forming a coat of a pre-flux for the protection of the circuit surfaces, mounting electronic parts on the printed circuit boards, forming a coat of a post-flux, and soldering. These fluxes contain gum rosin, wood rosin, modified rosin or the like as a major component dissolved in an alcohol, an ester, a ketone, an aromatic hydrocarbon, water or the like. The flux coats are applied in a liquid form by the following procedures: with a brush or with a roller; in a flux solution or in a bubbling flux solution for immersion; or by spraying.

These coating methods, however, present serious problems in that nonuniformity of the coats is encountered, the stability of the soldering and the function of the electronic parts are impaired because the solution of the flux will pass through inserting holes for lead wires into the non-coated surface side and penetrate into the inside thereof along the lead wires of the mounted electronic parts. Where an organic solvent of the alcohol or aromatic hydrocarbon type is employed, the flux coating step which is conducted immediately prior to the soldering step to be carried out at a high temperature causes other problems in that there is an increased risk of fire, and storage should be effected in accordance with rules and regulations related to handling dangerous materials.

SUMMARY OF THE INVENTION

Therefore, an object of the present invention is to provide a process for manufacturing a printed circuit board, in which the coating with a flux is simplified and a uniform flux layer is provided.

Another object of the present invention is to provide a process for manufacturing a printed circuit board, in which the handling of a flux is easy and entails no risk of fire during the soldering step.

A further object of the present invention is to provide a process for manufacturing a printed circuit board, in which the oxidation of copper print patterns on the printed circuit board can be effectively prevented.

A still further object of the present invention is to provide a process for manufacturing a printed circuit board, in which the coating with a flux can be carried out in one step.

A still further object of the present invention is to provide a process for manufacturing a printed circuit board, in which the copper print pattern can be effectively prevented from being damaged during storage, transfer and handling.

In accordance with one aspect of the present invention, there is provided a process for manufacturing a printed circuit board, which comprises the steps of coating one side of a flat supporting film with a soldering flux capable of being adhesive at room temperature and being activated to be readily adhesive by application of heat and pressure, attaching the coated surface of the supporting film to a soldering printed circuit board, applying heat and pressure from the non-coated surface of the supporting film to cause the flux to transfer to the printed circuit board, and soldering electronic parts thereto.

DETAILED DESCRIPTION OF THE PREFERRED EMBODIMENT

Figure 1:
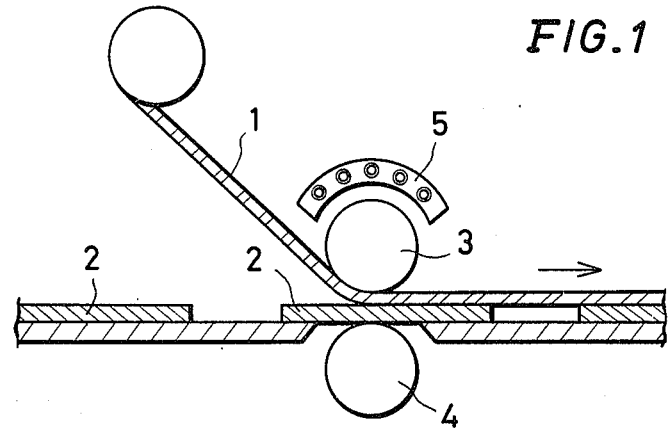
FIG. 1 is a sectional view illustrating a roll type transferring method in accordance with the present invention.

The present invention was accomplished with the situations involved in the prior art techniques taken into account, and uses the transferring method whereby a uniform coat is formed on a printed circuit board. The drawbacks as set forth hereinabove with respect to the prior art approaches, particularly the method of forming a coat of flux directly on a printed circuit board can be effectively solved. The process in accordance with the present invention enables the protection of copper print pattern portions from oxidation because the printed circuit board, the flux layer and the transferring base material are integral until the transferring base material is removed before the soldering step. It can also provide an extremely useful process for forming a flux coat, from the viewpoint of manufacture and performance, because the two coating steps involving a pre-flux and a post-flux can be reduced to only one step, oxidation of the flux can be prevented effectively prior to the soldering step by the presence of the transferring base material, and protection from damage to the copper print pattern portions can be effected during the storage, conveyance and handling up to the soldering step.

It is also to be noted that the removal of a supporting film as the transferring base material prior to the soldering step exerts no adverse influence upon the soldering, and that the soldering can be carried out in the same manner as in conventional procedures.

In accordance with the present invention, it is preferred to mount electronic parts on a printed circuit board after the transfer of flux thereto, although conventional approaches usually allow electronic parts to be mounted before the circuit board is coated with flux.

The coating with flux in accordance with the process of the present invention is carried out by the transferring method and a material to be employed for transferring the flux in accordance with the process of the invention is composed of a variety of transferring base materials coated with the flux.

The transferring base material or supporting film to be employed in the process according to the present invention is required to possess a flat surface, a mechanical strength high enough to permit coating with flux in the liquid form, good adhesion to retain the flux layer, and an adhesive strength of the flux to the supporting film weaker than the adhesive strength of the flux to the printed circuit board to thereby allow the flux to be transferred readily from the supporting film to the printed circuit board by the application of heat and pressure.

The transferring base material preferably has only a small plasticity in the heat treatment under pressure during the transferring step, and it must also possess good thermal conductivity. As a result of extensive review, the supporting films may include, for example, cellophane film, triacetate film, paper coated on one surface with a readily separable resin such as an aminoalkyd, urethane, polypropylene or the like; a thermoplastic resin film (although Japanese Patent Publication No. 55-10358 discloses a film-shaped flux for submerge area welding consisting of an integral laminate of a thermoplastic film and a flux, the method for manufacturing it totally differs from the method of the present invention) such as a polyamide series film, e.g., polyethylene terephthalate film, 6,6-nylon, 6-nylon, 11-nylon or the like; a polyolefin series film, e.g., polypropylene, polyethylene, or the like; an ethylene-methacrylic acid copolymer ion cross-linked (ionomer resin) film; an ethylene-vinyl acetate copolymer film; an ethylene-vinyl acetate copolymer saponified resin film; an ethylene-alpha-olefin copolymer film; a polycarbonate film; a theremoplastic elastomer film; or the like.

It is also meaningful that the surface energy on one side of the supporting film is rendered smaller than that on the other side thereof in order to avoid the transfer of flux to the back surface of the supporting film when the transferring material is stored in a roll after being coated with the flux. This can be accomplished by making surface states of the two sides of the supporting film different from each other or by laminating different films together. In the former case, the effect can be achieved by rendering the surface energy on one side larger than that on the other side by treating the former side thereof with corona discharge or by matting it by means of a mechanical or chemical treatment. In the latter case, there may be employed procedures involving dry lamination using an adhesive, coating with a resin using a T die extruder, or laminating films by the co-extruding method. Examples of these laminated films may include a film obtainable by laminating a low density polyethylene film on a high density polyethylene film, or a film obtainable by laminating a low density polyethylene film on a film of a low density polyethylene to which an aliphatic acid amide such as stearic amide, palmitic amide, oleic amide or erucic amide is added, whereby the surface energy is rendered small.

The thickness of the transferring supporting film is preferably about 0.01 to 0.20 mm from the viewpoint of physical strength, thermal conductance, cost and the like. As the softening point of the flux usually ranges from 100° to 500° C., the softening point of the supporting film should be taken into consideration in determining the transferring temperature to activate the flux by heating and promote adhesiveness and stickiness. To provide the supporting film with heat resistance, it is desired that the softening point be higher than about 100° C.

The flux component may include, for example, wood rosin, gum rosin or tall oil rosin, each rosin containing as a major component a mixed melting material of a monovalent carboxylic acid represented by the formula $C_{19}H_{29}COOH$ and having an alkylhydrophenanthrene nucleus; or the flux component may be one containing as a major component a polymerized rosin obtainable by dimerizing these rosins, a modified rosin obtainable by hydrogenation, disproportionation, esterification or the like, or a mixture of the modified rosins to which a variety of additives is added. Such additives may include, for example, activating agents comprising an organic halogen compound, e.g., aniline hydrochloride, naphthalamine hydrochloride, hydroxylamine hydrochloride, naphthalene hydrochloride, hydrazine hydrochloride, cetylpyridinium bromide, dimethylcetylammonium bromide or the like; and an amine or an amide, e.g., aniline, urea, ethylene diamide, acetamide or the like. In order to enhance the effect of the activating agent, it is preferable to add thereto an organic acid such as latic acid, palmitic acid, oleic acid, stearic acid, glutamic acid or the like. As another additive, there may be employed a film-reinforcing agent including, for example, ethyl celulose, butyral, polyamide, wax, ethylene-vinyl acetate copolymer or the like. It is also possible to further add thereto a plasticizer such as dioctyl adipate (DOA), dioctyl phthalate (DOP) or the like.

In accordance with the present invention, as hereinabove mentioned, it is preferable to mount the parts by soldering subsequent to the transferring of the flux. It is thus necessary that a sufficient amount of the flux be attached to the lead wires when mounting the parts. Wherever sufficient flux is not attached, the soldering cannot be carried out. It is thus most preferable that the flux contain:

(a) 100 parts by weight of a rosin composition containing 30–70% by weight of a low softening point rosin having a softening point of 50°–70° C.;

(b) an activating agent comprising the organic halogen compound in an amount so as to provide a halogen content of 0.1 to 0.5% by weight with respect to 100 parts by weight of the aforesaid rosin composition (a);

(c) 1–7 parts by weight of the organic acid;

(d) 5–20 parts by weight of an ethylene-vinyl acetate copolymer resin having a vinyl acetate content of 60–90%; a solvent and, if necessary, a plasticizer. The amount of the rosin composition (a) may be in the range of 50 to 85% by weight based on the total weight of the components (a), (b), (c) and (d) above.

In accordance with the present invention, the coating with the flux solution of the supporting film as a transferring base material may be carried out by coating methods such as roll coating, gravure coating, blade coating or the like, so that a coat of desirable thickness can be provided. The preferred dry coating amount may be in the range of 3 to 20 g/m². If the coating amount is too small, insufficient flux is attached to the lead wires. If the amount is too large, the appearance of the printed circuit board will be impaired.

The flux transferring method in accordance with the present invention involves transferring the flux from the supporting film as a transferring base material to a printed circuit board under the action of heat and pressure, said flux being first coated on the supporting film, as set forth hereinabove. This transferring method is applicable to plate printed circuit boards as conventionally used as well as to flexible printed circuit boards; it has no laminations as to the shape and material of the base board. This method also can be applied to circuit boards on all or part of which transferring patterns have been transferred.

The mode of transferring the flux to the printed circuit board may be of the roll type or of the plate type.

As shown in FIG. 1, the transferring by means of the roll type system can be carried out by rolling a rubber or a metal roll 3 heated by a heater 5 on a flux transferring sheet 1 and a printed circuit board 2, whereby pressure is applied under the application of heat to the printed circuit board to transfer the flux from the transferring sheet. It is desirable in this system to use as the hot roll 3 a rubber roll composed of silicone rubber or the like, and a metal roll as a supporting roll 4.

Figure 2:
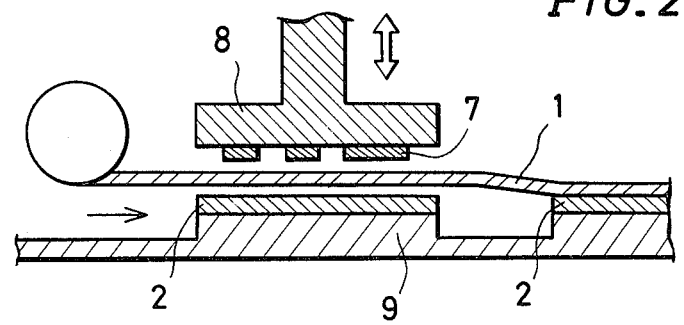
FIG. 2 is a sectional view illustrating a plate type transferring method in accordance with the present invention.

Referring now to FIG. 2, the transferring operation by means of the plate type system can be carried out by pressing a pattern mold 7 equipped with a hot plate 8 downwardly on a printed circuit board 2 arranged on a supporting plate 9, whereby the transferring of the flux is effected under the application of heat and pressure. It is desirable to apply the roll type system to a transferring operation involving the whole area of the transferring base material, and to apply the plate type system to a transferring operation involving only part of the transferring base material.

Figure 3:
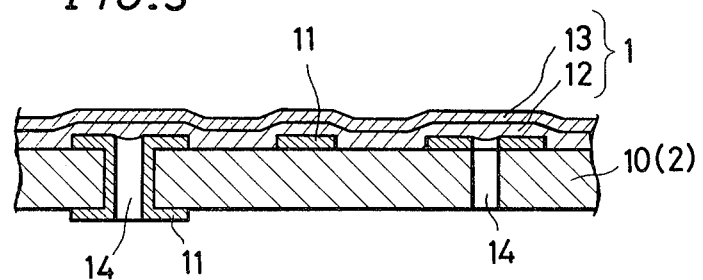
FIG. 3 is a sectional view illustrating an integrated structure of a printed circuit board and a flux transferring film.

Turning now to FIG. 3, the flux transferring sheet 1 prepared by coating the supporting film 13 with flux 12 is trimmed along the shape of a printed circuit board 10 after the flux has been transferred, whereby the flux transferring sheet 1 becomes integral with the printed circuit board 10. The printed circuit board is provided with a copper pattern portion 11 and through holes 14.

The supporting film is then removed from the base board on which the flux has been transferred. After lead wires of electronic parts are inserted through the holes in the base board surface, the surface to which the flux is transferred is immersed in a solder bath, whereby the parts are soldered to the printed circuit board. It is advantageous to attach a large amount of flux to the lead wires by blowing hot air on the flux surfaces after the insertion of the lead wires and prior to the soldering. In this case, it is preferable to blow the hot air at an angle of about 45° or less while continuously varying the direction in which the hot air is blown.

As hereinabove set forth, the present invention consists of the steps of forming a flux resin layer on a supporting film, attaching the supporting film to a printed circuit board so as to allow the flux layer to adhere to the printed circuit board surface by the application of heat and pressure, and removing the supporting film immediately prior to the soldering step. In accordance with the present invention, the printed circuit board, the flux and the supporting flux are integral up to the soldering step. This can provide a number of advantages with respect to performance and manufacturing procedures, and those advantages could not be achieved by conventional approaches involved in coating printed circuit boards with liquid fluxes. The process in accordance with the present invention serves to prevent both copper patterns on the printed circuit material and flux from being oxidized, and it protects the copper foil disposed on the circuit board from damage resulting from external factors. It also enables shortening of the steps of forming coats of a pre-flux and a post-flux to only one step for providing the flux in an appropriate amount. The flux coating layer formed in accordance with the process of the invention does not contain any solvent when the flux is transferred to the printed circuit board, so that various drawbacks encountered in conventional approaches of coating printed circuit board with a flux solution can be effectively eliminated.

EXAMPLE 1

A flux solution having the following composition was prepared:

Gum rosin: 50 parts by weight;
Oxidized wax: 6 parts by weight;
Ethylamine hydrochloride: 2 parts by weight;
Dioctyl adipate: 2 parts by weight;
Toluene: 20 parts by weight;
Iospropyl alcohol: 20 parts by weight.

The flux solution was applied in a coat on cellophane film #300 (thickness, 0.022 mm; manufactured by Nimura Kagaku Kogyo K.K.) by means of the gravure coating method using a gravure sheet having a thickness of $60\mu$. The flux amount was found to be 8 $g/m^2$ after the film was dried at about 80° C.

A printed circuit board was prepared by printing an etching resist on a laminated plate obtained by laminating a copper foil on a base plate, etching, removing the etching resist, printing a solder resist, curing, printing letters or symbol marks on the base plate, and then punching.

The cellophane transferring sheet obtained hereinabove was attached to the printed circuit board and subjected to the transferring method. The transferring operation was carried out with a roll transferring device using a silicone rubber roll under the conditions of: the roll surface temperature, 80° C.; pressure, 5 $kg/cm^2$; transferring speed, 10 m/minute.

EXAMPLE 2

A flux solution having the following composition was prepared:

Gum rosin: 50 parts by weight;
Cyclized rubber: 8 parts by weight;
Ethylamine hydrochloride: 1 part by weight;
Dioctyl adipate: 1 part by weight;
Toluene: 40 parts by weight.

The flux solution was coated in the same manner as in Example 1 on cellophane film #300 which had been previously subjected on one side to friction treatment with a treating agent containing a long chain alkyl acrylate copolymer composed of $CH_2-CH(COOC_{18}H_{37})$ and $CH_2-CH(COOH)$ (ratio 3:2). Using the transferring paper thus prepared, the transferring treatment was carried out in the same manner as in Example 1.

EXAMPLE 3

A flux solution having the following composition was prepared:

Gum rosin: 50 parts by weight;
Ethylene-vinyl acetate copolymer: 5 parts by weight;
Amino acid: 3 parts by weight;
Dioctyl adipate: 2 parts by weight;
Iospropyl alcohol: 40 parts by weight.

A non-oriented polypropylene film having a thickness of $20\mu$, on one side of which had been added 2,000 p.p.m. of stearic amide as a slipping agent, was laminated on a low density polyethylene film having a thickness of $20\mu$; the surface of the polyethylene film of the laminate thus obtained was then subjected to corona discharge treatment.

The flux solution having the above composition was then applied in a coat on the surface of the laminated film on which the corona discharge treatment was carried out in the same manner as in Example 1 to produce a transferring sheet. The transferring paper was then involved in the transferring of the flux in the same manner an in Example 1.

EXAMPLE 4

A flux solution having the following composition was prepared:

Gum rosin: 54 parts by weight;
Unsaturated polyester resin: 4 parts by weight;
Ethylamine hydrochloride: 1 part by weight;
Dioctyl adipate: 1 part by weight;
Toluene: 20 parts by weight;
Ethyl acetate: 20 parts by weight.

The flux solution was applied in a coat on a polyester film (trade name: Lumiler; Toray Industries Inc.) having a thickness of 25μ in the same manner as in Example 1 to give a transferring sheet. This transferring sheet was used to transfer the flux to copper pattern portions of a printed circuit board by means of the plate type transferring method as shown in FIG. 2, at a mold surface temperature of 90° C., a pressure of 5 kg/cm² and a speed of 30 shots per minute.

The transferring sheet was removed from the printed circuit board obtained by forming the flux coat thereon as in each of Examples 1 to 4, and then heated. Thereafter, the circuit board was soldered at a temperature of 250° C. in a flush-type soldering bath. It was found that favorable soldering was effected, and no permeation of the flux into the surface on which the parts were mounted was recognized.

EXAMPLE 5

A flux solution having the following composition was prepared:

Wood rosin WW (softening point, 80° C.): 25 parts by weight;
Modified rosin (ester-modified, hydrogenated rosin; softening point, 65° C.): 25 parts by weight;
Ethylene-vinyl acetate copolymer resin (vinyl acetate content, 70%): 5 parts by weight;
Cetylpyridinium bromide: 1 part by weight;
Ethylamine hydrochloride: 1 part by weight;
Palmitic acid: 2 parts by weight;
Isopropylalcohol (solvent): 41 parts by weight.

The flux solution was applied in a coat on a high density polyethylene film having a thickness of 100μ by the gravure coating method using a gravure plate having a depth of 100μ. The dry amount of the coat was found to be 12 g/m².

The transferring sheet thus prepared was attached to a printed circuit board which had been prepared in the same manner as in Example 1 and subjected to the transferring treatment by means of the roll-type transferring machine having a silicone rubber roll at the roll surface temperature of 100° C. and the transferring speed of 5 m/min under the pressure of 4 kg/cm².

After the circuit board was cooled and the supporting film of the high density polyethylene film was removed therefrom, electronic parts were mounted thereon and the resultant circuit board was soldered in a flush-type soldering bath. It was found that no pinholes and irregular projections were recognized and a favorable soldering joint was provided. It was also noted that no intrusion of the flux into the back surface of the printed circuit board was recognized with an extremely good soldering.

In the procedures following Example 5 with the exception that wood rosin WW (softening point, 80° C.) was used in the amount of 50 parts without using the modified rosin, it was found that three pinholes occurred with respect to 100 lead wires of electronic parts.

EXAMPLE 6

A flux solution having the following composition was prepared:

Wood rosin: 25% by weight;
Gum rosin: 25% by weight;
Ethylene-vinyl acetate copolymer (vinylacetate content, 80%): 5% by weight;
Ethylamine hydrochloride: 2% by weight;
Palmitic acid: 5% by weight;
Dioctyl adipate: 3% by weight;
Isopropylalcohol: 35% by weight.

The resuntant flux solution was applied in a coat on a polyester film (manufactured by Toray Industries Inc.) having a thickness of 25μ by means of the gravure coating method using a gravure sheet having a depth of 35μ. The dry amount of the coated flux was found to be 15 g/m².

The transferring sheet thus prepared was attached to a printed circuit board which had been previously prepared in the same manner as in Example 1 and then used to transfer the flux thereon. The transferring was carried out by means of a roll-type transferring machine using a silicone rubber roll at the transferring speed of 5 m/min and the roll surface temperature of 100° C. under the pressure of 4 kg/cm².

After the circuit board was cooled, the polyester film used as supporting film was removed therefrom and electronic parts were mounted thereon. Thereafter, hot wind was blown on the flux-carrying surface obliquely at the angle of 45° while varying the direction of the wind continuously in order to dissolve the flux and concentrate the flux between the electrodes and the terminals. This procedure also serves to expand the wet areas to the terminal portions or lead wires and provides a uniform flux coating.

The resultant printed circuit board was subjected to soldering in a flush type soldering bath at the soldering temperature of 250° C. As a result, it was found that no pinholes or irregular projection were recognized and a favorable soldering was provided without causing any intrusion of the flux into the back surface of the printed circuit board.

What is claimed is:

1. A process for manufacturing a printed circuit board comprising the steps of:
   coating one side of a flat supporting film with a soldering flux which can adhere to the supporting film at room temperature and which can be activated so as to be readily adhesive through the application of heat and pressure;
   attaching the supporting film to a printed circuit board so as to bring the flux-coated surface of the supporting film in contact with a soldering surface of the printed circuit board;
   applying heat and pressure to a non-coated surface of the supporting film so as to transfer the flux to the printed circuit board;
   separating the support film from the flux coated soldering surface; and
   soldering electronic parts onto flux coated portions of the printed circuit board.

2. A process according to claim 1, wherein the flux comprises:

(a) 100 parts by weight of a rosin composition containing 30 to 70% by weight of a low softening point rosin having a softening point of 50° to 70° C.;
(b) an activating agent comprising an organic halogen compound in an amount so as to provide a halogen content of 0.1 to 0.5% by weight based on 100 parts by weight of the rosin composition (a) above;
(c) 1 to 7 parts by weight of an organic acid selected from the group consisting of lactic acid, palmitic acid, oleic acid, stearic acid and glutamic acid and mixtures thereof;
(d) 5 to 20 parts by weight of an ethylene-vinyl acetate copolymer resin having a vinyl acetate content of 60 to 90%; and
a solvent.

3. A process according to claim 1, wherein the supporting film is coated with the flux in the amount of 3 to 20 g/m² in dry state.

4. A process according to claim 1, wherein the flux is transferred to the soldering printed circuit board and hot air is blown from an oblique direction on the flux-coated surface.

5. A process according to claim 1 wherein the surface energy of one side the supporting film is smaller than that of the other side of the supporting film.

6. A process according to claim 1 wherein the thickness of the supporting film is about 0.01 to 0.20 mm and the softening point thereof is higher than about 100° C.

7. A process according to claim 2, wherein the supporting film is coated with the flux in an amount of about 3 to 20 g/m² in dry state.

8. A process according to claim 2, wherein the flux is transferred to the soldering printed circuit board and hot air is blown from an oblique direction on the flux coated surface.

9. A process according to claim 8 wherein said rosin composition contains wood rosin, gum rosin or tall oil rosin.

10. A process according to claim 9 wherein the organic halogen compound is aniline hydrochloride, naphthylamine hydrochloride, hydroxylamine hydrochloride, naphthylene hydrochloride, hydrazine hydrochloride, ethylamine hydrochloride, cetylpyridinum bromide or dimethylcetylammonium bromide.

11. A process according to claim 10 wherein said oblique direction is about 45°.

12. A process according to claim 11, wherein said flux contains wood rosin, gum rosin and ethylamine hydrochloride, the flat supporting film is a polyester film.

13. A process according to claim 4 wherein said oblique direction is about 45°.

14. A process according to claim 1, wherein said flux contains gum rosin and ethylamine hydrochloride and said supporting film is cellophane.

15. A process according to claim 2, wherein said supporting film has a thickness of 0.01–0.2 mm and a softening point above about 100° C. and one surface thereof has a greater surface energy than the other surface thereof and wherein the supporting film is coated with the flux in the amount of 3 to 20 g/m² in dry state.

16. A process according to claim 15, wherein the flux is transferred to the soldering printed circuit board and hot air is blown from an oblique direction on the flux coated surface.

17. A process according to claim 16 wherein the oblique direction is about 45°.

* * * * *